United States Patent
Kim et al.

(10) Patent No.: US 9,318,647 B2
(45) Date of Patent: Apr. 19, 2016

(54) METHOD OF MANUFACTURING SEMICONDUCTOR LIGHT EMITTING DEVICE

(71) Applicant: SAMSUNG ELECTRONICS CO., LTD., Suwon-Si, Gyeonggi-do (KR)

(72) Inventors: Bum Joon Kim, Seoul (KR); Seung Woo Choi, Seoul (KR); Sung Tae Kim, Seoul (KR); Young Min Park, Hwaseong-si (KR); Eun Deok Sim, Yongin-si (KR); Sung Pyo Lee, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/490,438

(22) Filed: Sep. 18, 2014

(65) Prior Publication Data
US 2015/0207026 A1    Jul. 23, 2015

(30) Foreign Application Priority Data

Jan. 21, 2014 (KR) .................. 10-2014-0007116

(51) Int. Cl.
*H01L 33/00* (2010.01)
*H01L 21/78* (2006.01)
*H01L 21/762* (2006.01)

(52) U.S. Cl.
CPC ...... *H01L 33/0075* (2013.01); *H01L 21/76251* (2013.01); *H01L 21/7806* (2013.01); *H01L 33/0079* (2013.01); *H01L 33/0066* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/73265* (2013.01); *H01L 2224/8592* (2013.01)

(58) Field of Classification Search
CPC ..... H01L 33/0079; H01L 33/62; H01L 33/12; H01L 33/005; H01L 33/007; H01L 33/0075; H01L 33/405; H01L 2924/3512; H01L 21/7806; H01L 21/76251
USPC .............................. 438/22, 26, 458
See application file for complete search history.

(56) References Cited

U.S. PATENT DOCUMENTS

| 6,372,608 | B1 | 4/2002 | Shimoda et al. | |
|---|---|---|---|---|
| 6,531,328 | B1 * | 3/2003 | Chen ............................ | 438/26 |
| 6,645,830 | B2 | 11/2003 | Shimoda et al. | |

(Continued)

FOREIGN PATENT DOCUMENTS

| JP | 2011-049466 A | 3/2011 |
|---|---|---|
| JP | 2012-033729 A | 2/2012 |

(Continued)

*Primary Examiner* — Michael Trinh
(74) *Attorney, Agent, or Firm* — McDermott Will & Emery LLP

(57) ABSTRACT

A method of manufacturing a semiconductor light emitting device includes forming a light emitting structure layer including an active layer on a first substrate. A second substrate is bonded to the light emitting structure layer at a first temperature higher than room temperature. The first substrate is removed from the light emitting structure layer at a second temperature higher than room temperature. The second substrate and the light emitting structure are cooled to reach room temperature. A coefficient of thermal expansion of the second substrate is different from a coefficient of thermal expansion of the active layer.

16 Claims, 9 Drawing Sheets

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,244,965 B2 * | 7/2007 | Andrews et al. | 257/98 |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,030,665 B2 | 10/2011 | Nagahama et al. | |
| 8,049,161 B2 | 11/2011 | Sherrer et al. | |
| 8,129,711 B2 | 3/2012 | Kang et al. | |
| 8,153,509 B2 * | 4/2012 | Kim et al. | 438/458 |
| 8,179,938 B2 | 5/2012 | Kim | |
| 8,263,987 B2 | 9/2012 | Choi et al. | |
| 8,283,191 B2 | 10/2012 | Rode et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2010/0123158 A1 | 5/2010 | Kim et al. | |
| 2011/0177638 A1 * | 7/2011 | Romano et al. | 438/29 |
| 2012/0070958 A1 | 3/2012 | Furukawa et al. | |
| 2012/0322186 A1 * | 12/2012 | Rode et al. | 438/29 |
| 2013/0137220 A1 | 5/2013 | Matsubara et al. | |
| 2013/0181188 A1 * | 7/2013 | Ooshika | 257/13 |
| 2013/0203195 A1 | 8/2013 | Kim et al. | |

FOREIGN PATENT DOCUMENTS

| | | |
|---|---|---|
| KR | 10-0907223 B1 | 7/2009 |
| KR | 10-0999548 B1 | 12/2010 |
| KR | 10-2011-0070521 A | 6/2011 |
| KR | 10-2012-0045838 A | 5/2012 |

* cited by examiner

METHOD OF MANUFACTURING SEMICONDUCTOR LIGHT EMITTING DEVICE

CROSS-REFERENCE TO RELATED APPLICATION

This application claims benefit of priority to Korean Patent Application No. 10-2014-0007116, filed on Jan. 21, 2014, with the Korean Intellectual Property Office, the entire content of which is incorporated herein by reference.

TECHNICAL FIELD

The present disclosure relates to a method of manufacturing a semiconductor light emitting device.

BACKGROUND

In general, in manufacturing a nitride semiconductor light emitting device, a light emitting structure layer is formed on a sapphire substrate, and here, a sapphire substrate is an electrical insulator having poor thermal conductivity, limiting manufacturing capabilities in terms of high output, high luminance light emitting devices. For this reason, after a light emitting structure layer is formed on a growth substrate such as a sapphire substrate, a support substrate may be bonded thereto and the growth substrate may be removed. In this case, in order to remove the growth substrate, a laser lift-off or a chemical lift-off process is commonly used.

Meanwhile, when a light emitting structure layer of a semiconductor lighting device is formed on a growth substrate, stress is induced in the growth substrate and the light emitting structure layer due to differences in lattice constants and coefficients of thermal expansion between the light emitting structure layer and the growth substrate, affecting luminous efficiency of the semiconductor lighting device.

SUMMARY

An aspect of the present disclosure may provide a method of manufacturing a semiconductor light emitting device capable of enhancing luminous efficiency.

However, the object of the present disclosure is not limited thereto and the object and effects that may be recognized from technical solutions or embodiments described hereinafter may also be included while not explicitly mentioned.

One aspect of the present disclosure relates to a method of manufacturing a semiconductor light emitting device, including forming a light emitting structure layer including an active layer on a first substrate. A second substrate is bonded to the light emitting structure layer at a first temperature higher than room temperature. The first substrate is removed from the light emitting structure layer at a second temperature higher than room temperature. The second substrate and the light emitting structure are cooled to reach room temperature. A coefficient of thermal expansion of the second substrate is different from a coefficient of thermal expansion of the active layer.

In the forming of the light emitting structure layer, compressive or tensile stress may be induced in the active layer, and the compressive or tensile stress induced in the active layer may be relieved while the light emitting structure layer is cooled to reach room temperature.

The active layer may have compressive stress, and the coefficient of thermal expansion of the second substrate may be lower than the coefficient of thermal expansion of the active layer.

The second substrate may be any one material selected from the group consisting of Si, SiC, AlN, GaP, InP, and graphite.

The first substrate may be a sapphire substrate, and the light emitting structure layer including the active layer may include a Group III-V nitride semiconductive material.

The active layer may have tensile stress, and the coefficient of thermal expansion of the second substrate may be greater than the coefficient of thermal expansion of the active layer.

The second temperature may be lower than or equal to the first temperature.

A difference in coefficients of thermal expansion between the active layer and the second substrate may be within a range of $0.5 \times 10^{-6}$/K to $3.0 \times 10^{-6}$/K.

The bonding of the second substrate to the light emitting structure layer may be performed by eutectic bonding of a bonding metal.

The bonding metal may be a gold alloy having a eutectic temperature of 200° C. or higher.

The removing of the first substrate may be performed by laser lift-off (LLO).

A thickness of the second substrate may be greater than a thickness of the light emitting structure layer.

The method may further include forming an electrode on a surface of the light emitting structure layer from which the first substrate has been removed.

Another aspect of the present disclosure relates to a method of manufacturing a semiconductor light emitting device package, including manufacturing a semiconductor light emitting device according to the above-noted method of manufacturing a semiconductor light emitting device. The semiconductor light emitting device is mounted on one of a pair of lead frames. The semiconductor light emitting device is electrically connected to the other of the lead frames through a wire and to the one of the lead frames through the second substrate of the semiconductor light emitting device.

Still another aspect of the present disclosure encompasses a method of manufacturing a semiconductor light emitting device package, including manufacturing a semiconductor light emitting device according to the above-noted method of manufacturing a semiconductor light emitting device. The semiconductor light emitting device is mounted on a first portion of a mounting board. The semiconductor light emitting device is electrically connected to a second portion of the mounting board separated from the first portion through a wire, and to the first portion of the mounting board through the second substrate of the semiconductor light emitting device.

Still another aspect of the present disclosure relates to a method of manufacturing a semiconductor light emitting device, including forming, on a first substrate, a light emitting structure layer to include an active layer. It is determined whether compressive or tensile stress is induced in the active layer. Based on a result of the determination, a second substrate is selectively formed to have a material having a coefficient of thermal expansion lower than a coefficient of thermal expansion of the active layer or to have a material having a coefficient of thermal expansion greater than the coefficient of thermal expansion of the active layer. The second substrate is bonded to the light emitting structure layer at a first temperature higher than room temperature. The first substrate is removed from the light emitting structure layer at a second temperature higher than room temperature. The second substrate and the light emitting structure are cooled to reach room temperature.

The second substrate may be formed to have a material having a coefficient of thermal expansion lower than the coefficient of thermal expansion of the active layer, when it is determined that compressive stress is induced in the active layer.

The second substrate may be formed to have a material having a coefficient of thermal expansion greater than the coefficient of thermal expansion of the active layer, when it is determined that tensile stress is induced in the active layer.

BRIEF DESCRIPTION OF DRAWINGS

The above and other aspects, features and other advantages of the present disclosure will be more clearly understood from the following detailed description taken in conjunction with the accompanying drawings, in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Hereinafter, exemplary embodiments of the present inventive concept will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIGS. 1 through 4 are cross-sectional views schematically illustrating a sequential process of a method of manufacturing a semiconductor light emitting device according to an exemplary embodiment of the present inventive concept.

Figure 5:
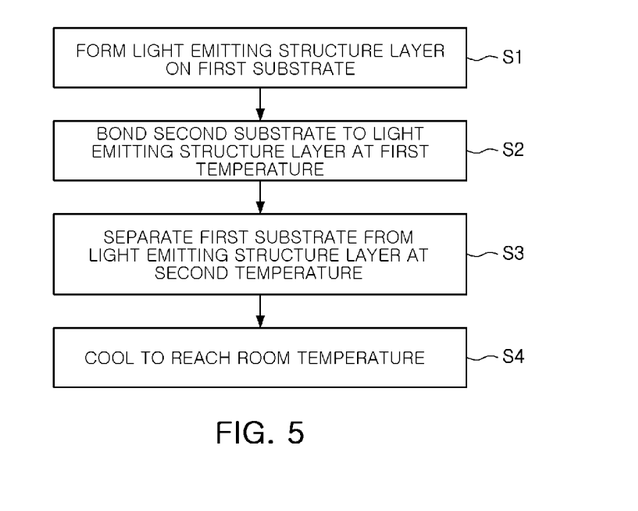
FIG. 5 is a flow chart illustrating a method of manufacturing a semiconductor light emitting device according to an exemplary embodiment of the present inventive concept.

FIG. 5 is a flow chart illustrating a method of manufacturing a semiconductor light emitting device according to an exemplary embodiment of the present inventive concept.

Figure 1:
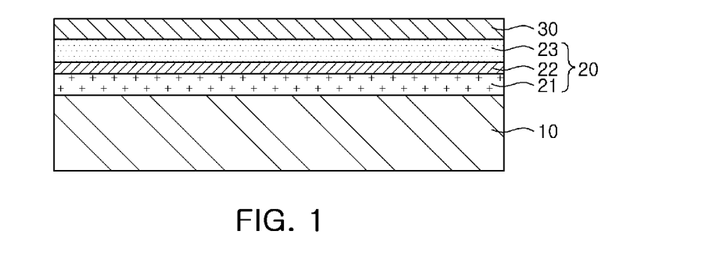
FIGS. 1 through 4 are cross-sectional views schematically illustrating a sequential process of a method of manufacturing a semiconductor light emitting device according to an exemplary embodiment of the present inventive concept.

Referring to FIGS. 1 and 5, a method of manufacturing a semiconductor lighting device according to an exemplary embodiment of the present inventive concept may include operation S1 of forming a light emitting structure layer on a first substrate 10. Here, the light emitting structure layer refers to a structure including an active layer 22 emitting light and first and second semiconductor layers 21 and 23 disposed above and below the active layer 22, respectively.

The first substrate 10 may be used as a growth substrate for growing the light emitting structure layer 20, and a sapphire substrate may be typically used as the first substrate 10. A sapphire substrate is a crystal having Hexa-Rhombo R3c symmetry, of which lattice constants in c-axial and a-axial directions are 13.001 Å and 4.758 Å, respectively, and has a C-plane (0001), an A-plane (1120), an R-plane (1102), and the like. In this case, the C-plane of sapphire crystal allows a nitride thin film to be relatively easily grown thereon and is stable at high temperatures, so the sapphire substrate is advantageously used as a substrate for growing a nitride semiconductor. According to an exemplary embodiment of the present inventive concept, a substrate formed of SiC, GaN, ZnO, $MgAl_2O_4$, MgO, $LiAlO_2$, $LiGaO_2$, or the like, may also be used.

In the structure of the light emitting structure layer 20, the first and second semiconductor layers 21 and 23 and the active layer 22 disposed therebetween may be formed of a Group III-V nitride semiconductor, for example, a material having a composition of $Al_xIn_yGa_{1-x-y}N$ ($0 \leq x \leq 1$, $0 \leq y \leq 1$, $0 \leq x+y \leq 1$), or may be formed of AlInGaP or AlInGaAs-based material. Also, the first and second semiconductor layers 21 and 23 may be respectively doped with n-type and p-type impurities. The active layer 22 disposed between the first and second semiconductor layers 21 and 23 may emit light having a predetermined level of energy according to electron-hole recombination and may have a multi-quantum well (MQW) structure in which quantum well layers and quantum barrier layers are alternately laminated. The first and second semiconductor layers 21 and 23 and the active layer 22 may be grown through a process known in the art, such as metal-organic chemical vapor deposition (MOCVD), hydride vapor phase epitaxy (HVPE), molecular beam epitaxy (MBE), or the like. Also, although not shown, before the first semiconductor layer 21 is formed on the first substrate 10, a buffer having various structures (crystalline, amorphous, and the like) may be formed to enhance crystallinity of the first semiconductor layer. For example, an undoped GaN layer may be formed as a buffer layer.

In general, when the light emitting structure layer 20 is grown at a temperature of approximately 1000° C. on the first substrate 10 and cooled to reach room temperature, stress may be induced in the light emitting structure layer 20 due to differences in lattice constants and coefficients of thermal expansion between the first substrate 10 and the light emitting structure layer 20. Namely, when a coefficient of thermal expansion of the first substrate 10 is greater than a coefficient of thermal expansion of the light emitting structure layer 20, compressive stress may be induced in the light emitting structure layer 20, and when the coefficient of thermal expansion of the first substrate 10 is lower than the coefficient of thermal expansion of the light emitting structure layer 20, tensile stress may be induced in the light emitting structure layer 20.

In an exemplary embodiment of the present inventive concept, for example, when the light emitting structure layer 20 composed of the GaN-based first and second semiconductor layers and the active layer 22 including InGaN is grown on the first substrate 10 as a sapphire substrate at a high temperature ranging from approximately 800° C. to 1200° C. and cooled to reach room temperature, since the coefficient of thermal expansion of the first substrate 10 is greater than the coefficient of thermal expansion of the light emitting structure layer 20, compressive stress may be induced in the light emitting structure layer 20 including the active layer 22. Also, the InGaN layer constituting the active layer 22 having a quantum well structure may have compressive stress additionally induced due to a difference in lattice constants between the InGaN layer and the first and second semiconductor layers 21 and 23, and such compressive stress may form piezoelectric polarization within the quantum well structure to deform an energy band structure and degrade internal quantum efficiency.

For reference, a coefficient of thermal expansion of sapphire is approximately $7.5 \times 10^{-6}$/K and that of the GaN-based semiconductor is approximately $5.6 \times 10^{-6}$/K. A lattice constant of GaN is 3.189 Å (a-axis) and 5.185 Å (c-axis), and in case of InGaN, a lattice constant thereof is increased as the content of indium (In) is increased.

Thereafter, a reflective metal layer 30 may be formed on the light emitting structure layer 20. The reflective metal layer 30 may be formed of a metal having electrically ohmic-characteristics with respect to the second semiconductor layer 23 and having a high level of reflectivity. In consideration of this function, the reflective metal layer 30 may be formed to include a material such as Ag, Ni, Al, Rh, Pd, Ir, Ru, Mg, Zn, Pt, Au, or the like. The reflective metal layer 30 may be formed through a process such as sputtering, or the like. In an exemplary embodiment of the present inventive concept, since the reflective metal layer 30 obtains an advantageous effect rather than being essential, the reflective metal layer 30 may be excluded.

Figure 2A:
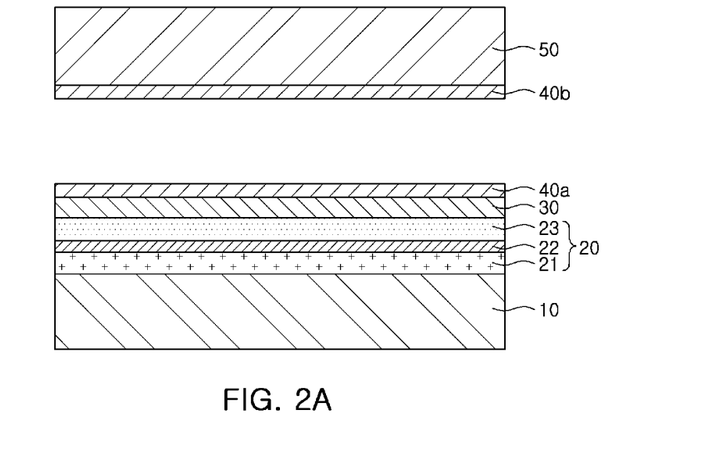
Figure 2B:
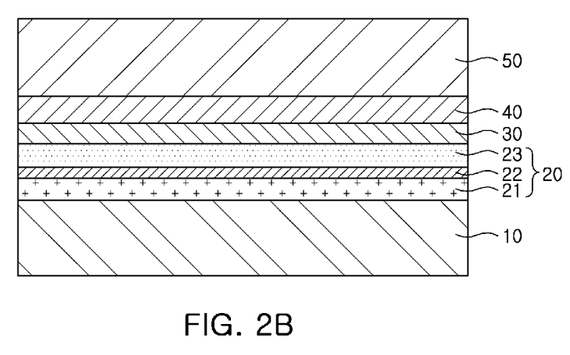

Referring to FIGS. 2A, 2B, and 5, operation S2 of bonding a second substrate 50 to the light emitting structure layer 20 may be performed.

The second substrate 50 may serve as a support supporting the light emitting structure layer 20 during a follow-up process of removing the first substrate 10, or the like. Also, when the second substrate 50 is formed of a conductive material, the second substrate 50 may be connected to an external power source to apply an electrical signal to the second semiconductor layer 23.

As described above, in an exemplary embodiment of the present inventive concept, when the light emitting structure layer 20 formed of a GaN-based semiconductor material is formed on the first substrate 10, luminous efficiency, specifically, internal quantum efficiency, of a light emitting device may be degraded due to compressive stress induced in the light emitting structure layer 20, in particular, within the active layer 22 as a light emitting unit. Thus, in order to relieve such stress during a follow-up cooling process as described hereinafter, the second substrate 50 may be selectively formed of a material having a coefficient of thermal expansion lower than a coefficient of thermal expansion of the active layer 22 to induce tensile stress in the active layer 22.

In this respect, the second substrate 50 may be formed of any one of materials among Si, SiC, GaP, InP, AlN, and graphite, and coefficients of thermal expansion of these materials are respectively $3.59 \times 10^{-6}$/K. $4.2 \times 10^{-6}$/K, $4.65 \times 10^{-6}$/K, $4.6 \times 10^{-6}$/K, $4.15 \times 10^{-6}$/K, and $3.0 \times 10^{-6}$/K. Also, in order to induce tensile stress in the light emitting structure layer 20 including the active layer 22, the second substrate 50 may have a thickness sufficiently greater than a thickness of the light emitting structure layer 20.

Conversely, when tensile stress is induced in the light emitting structure layer 20, in particular, in the active layer 22, the second substrate 50 may be formed of a material having a coefficient of thermal expansion greater than a coefficient of thermal expansion of the active layer 22 in order to relieve the tensile stress.

The process of bonding the second substrate 50 will be described in detail. First, as illustrated in FIG. 2A, a first bonding material layer 40a may be formed on the reflective metal layer 30, and a second bonding material layer 40b may be formed on the second substrate 50. The first and second bonding material layers 40a and 40b may be formed through e-beam evaporation, chemical or physical vapor deposition, or the like. According to an exemplary embodiment of the present inventive concept, the first bonding material layer 40a may be formed directly on the light emitting structure layer 20. Also, although not shown, a diffusion barrier layer may be formed between the second substrate 50 and the second bonding material layer 40b in order to prevent diffusion of a metal.

Next, as illustrated in FIG. 2B, the first and second bonding material layers 40a and 40b may be melted at a first temperature higher than room temperature to form a bonding layer 40 to bond the second substrate 50 to the light emitting structure layer 20. In this case, in order to facilitate the bonding, pressure may be applied.

In the related art, a bonding metal having a relatively low eutectic temperature is used to minimize bowing or distortion of a substrate during a cooling process to reach room temperature, but in an exemplary embodiment of the present inventive concept, an alloy having a relatively high eutectic temperature of 200° C. or higher may be used as a bonding metal.

When the first temperature, a temperature for bonding the second substrate, is high, a second temperature during a process of separating the first substrate 10 (see FIG. 3) as described hereinafter may be increased, which may resultantly increase the effect of alleviating stress due to difference in coefficients of thermal expansion between the second substrate 50 and the active layer 22 during a process of performing cooling after the separation. Thus, as a material of the bonding layer 40, an AuSn ally (eutectic temperature: approximately 280° C.), an AuGe ally (eutectic temperature: approximately 350° C.), an AuSi ally (eutectic temperature: approximately 380° C.), or the like, may be used. Since bonding is performed at the relatively high first temperature, the light emitting device may be heat-treated at a high temperature in a follow-up process, and thus, quality and operation stability of the light emitting device may be enhanced.

Figure 3:
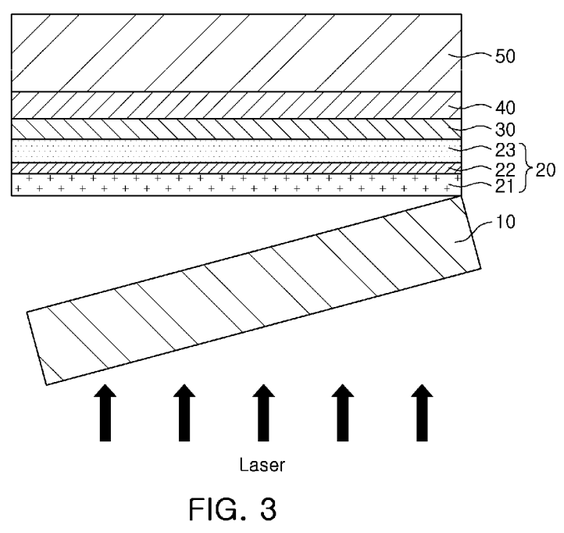

Thereafter, referring to FIGS. 3 and 5, operation S3 of separating the first substrate 10 used for growing the nitride semiconductor layers from the light emitting structure layer 20 may be performed through a laser lift-off (LLO) scheme.

When a laser is irradiated from the first substrate 10, since the first substrate 10 is a light-transmissive substrate, the first semiconductor layer 21 may be decomposed by energy absorbed to an interface between the first substrate 10 and the first semiconductor layer 21, whereby the first substrate 10 is separated. Also, although not shown in detail, when a buffer layer is formed between the first substrate 10 and the first semiconductor layer 21, the buffer layer may be decomposed to separate the first substrate 10.

The process of separating the first substrate 10 may be performed at a second temperature higher than room temperature. The second temperature may vary depending on a eutectic alloy of the bonding layer 40, and may be lower than or equal to the first temperature. In an exemplary embodiment of the present inventive concept, when the bonding layer 40 is formed of AuSn, a process of separating the first substrate 10 may be performed at the second temperature ranging from 250° C. to 280° C.

Thereafter, referring to FIG. 5, after the first substrate 10 is removed, operation S4 of cooling the second substrate 50 and the light emitting structure layer 20 to reach room temperature may be performed.

The second substrate 50 and the light emitting structure layer 20 including the active layer 22 in a bonded state may be contracted while being cooled from the second temperature to room temperature, and at this time, thermal stress may be induced in the light emitting structure layer 20 due to a difference in coefficients of thermal expansion between the second substrate 50 and the light emitting structure layer 20, and thus, residual stress on the active layer 22 may be relieved.

In an exemplary embodiment of the present inventive concept, the silicon substrate having a coefficient of thermal expansion lower than a coefficient of thermal expansion of the active layer 22 may be bonded as the second substrate 50 and thereafter, the first substrate 10 may be separated through a laser lift-off (LLO) at the second temperature. During the process of cooling the light emitting structure layer 20 and the second substrate 50 in bonded state, the second substrate 50 may be less contracted than the active layer 22, inducing tensile stress in the active layer 22 to relieve the residual compressive stress in the active layer 22.

Subsequently, referring to FIG. 4, a first electrode 60 may be formed on the first semiconductor layer 21 exposed as the first substrate 10 is removed.

The first electrode 60 may be connected to an external power source to apply an electrical signal to the first semiconductor layer 21. The first electrode 60 may be formed of an electrically conductive material, for example, one of materials among silver (Ag), aluminum (Al), nickel (Ni), chromium (Cr), or the like, and may be formed through a process such as sputtering, or the like.

Figure 6A:
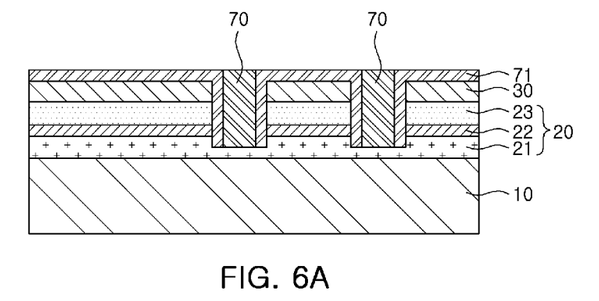
FIGS. 6A through 6C are cross-sectional views schematically illustrating a sequential process of a method of manufacturing a semiconductor light emitting device according to an exemplary embodiment of the present inventive concept.
Figure 6B:
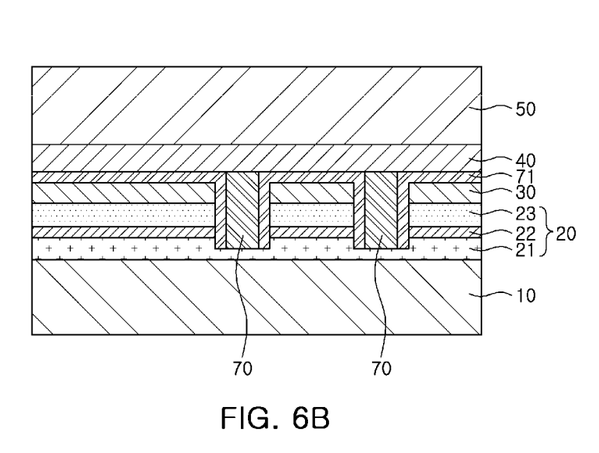
Figure 6C:
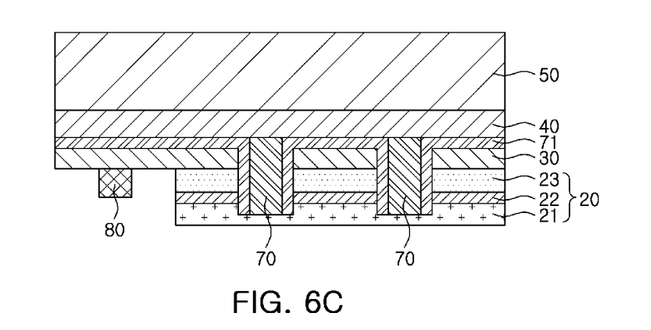

FIGS. 6A through 6C are cross-sectional views schematically illustrating a sequential process of a method of manufacturing a semiconductor light emitting device according to an exemplary embodiment of the present inventive concept.

Referring to FIG. 6A, conductive vias 70 electrically connecting the first semiconductor layer 21 and the second substrate 50 may be formed.

First, the first semiconductor layer 21, the active layer 22, the second semiconductor layer 23, and the reflective metal layer 30 may be formed through a method according to the exemplary embodiment of FIG. 1. Next, the conductive vias 70 penetrating through the reflective metal layer 30, the second semiconductor layer 23, and the active layer 22 may be formed. The first semiconductor layer 21 may be electrically connected to the second substrate 50 through the conductive vias 70, and here, the amount, shape, pitch, and the like, of the conductive vias 70 may be appropriately adjusted to lower contact resistance.

For electrical insulation, an insulating layer 71 may be formed on the periphery of the conductive vias 70 and on the reflective metal layer 30. The insulating layer 71 may be formed of a material as long as it has electrical insulating properties, but in terms of minimizing light absorption, the insulating layer 71 may be formed of, for example, a silicon oxide, a silicon oxynitride, or a silicon nitride, such as $SiO_2$, $SiO_xN_y$, $Si_xN_y$.

Thereafter, as illustrated in FIG. 6B, the second substrate 50 may be bonded to the conductive vias 70 and the insulating layer 71 through the medium of a bonding layer 40.

Here, the second substrate 50 may be bonded to the conductive vias 70 and the insulating layer 71 by eutectic bonding at the first temperature through a method of the exemplary embodiment of FIGS. 2A and 2B.

Thereafter, referring to FIG. 6C, the first substrate 10 may be separated, a portion of the light emitting structure layer 20 may be removed, and a second electrode 80 may be formed.

In this case, as described above with reference to FIGS. 3 through 5, operation S3 of separating the first substrate 10 through a laser lift-off (LLO) at the second temperature and operation S4 of cooling the resultant structure to reach room temperature may be performed. In order to apply an electrical signal to the second semiconductor layer 23, a portion of the light emitting structure layer 20 may be removed to expose a portion of the surface of the reflective metal layer 30, and the second electrode 80 may be formed on the exposed portion of the reflective metal layer 30. With this electrode connection scheme, an electrode may not be formed on a surface of the first semiconductor layer 21, thereby enhancing light extraction efficiency.

Figure 7:
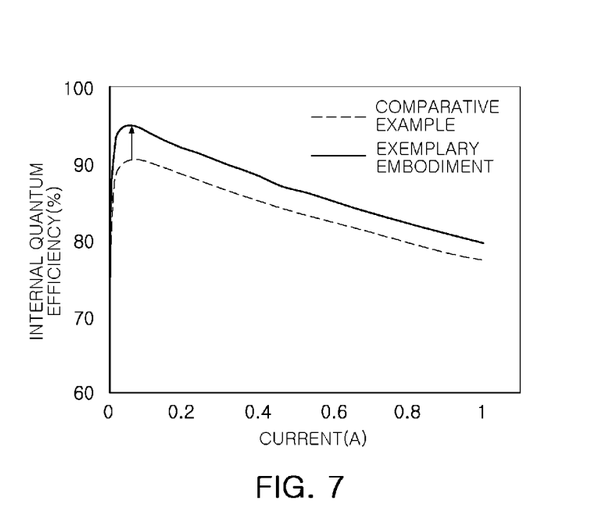
FIG. 7 is a graph illustrating characteristics of a semiconductor light emitting device according to an exemplary embodiment of the present inventive concept.

FIG. 7 is a graph illustrating characteristics of a semiconductor light emitting device according to an exemplary embodiment of the present inventive concept.

Figure 4:
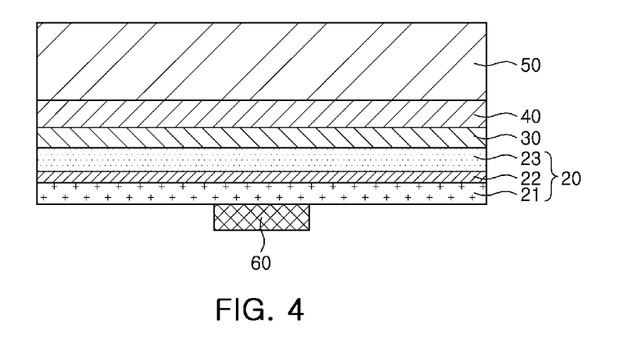

Referring to FIG. 7 together with FIG. 4, when the light emitting structure layer 20 is formed with a GaN-based nitride semiconductor on the first substrate 10 as a sapphire substrate according to an exemplary embodiment of the present inventive concept, compressive stress may be induced in the light emitting structure layer 20 including the active layer 22.

In this case, according to an exemplary embodiment of the present inventive concept, a silicon substrate, as the second substrate 50, having a coefficient of thermal expansion lower than a coefficient of thermal expansion of the active layer 22 may be bonded through the medium of the AuSn bonding layer 40 at the first temperature of 300° C., the first substrate 10 may be separated through a laser lift-off (LLO) at the second temperature ranging from 250° C. to 280° C., and the resultant structure may be subsequently cooled to reach room temperature. Also, in a comparative example, a SiAl substrate, as the second substrate 50, having a coefficient of thermal expansion similar to a coefficient of thermal expansion of the active layer 22 was bonded by the medium of the AuSn bonding layer 40, the resultant structure was cooled to reach room temperature, and the first substrate 10 was subsequently removed through a laser lift-off (LLO).

When compared, it was confirmed that the use of the silicon substrate as the second substrate 50 according to an exemplary embodiment of the present inventive concept enhanced internal quantum efficiency of a manufactured semiconductor light emitting device by 2% or more than the use of the SiAl substrate (comparative example). Also, it was observed that the lattice constant of the a-axis of GaN constituting the light emitting structure layer 20 was further increased in the case of using the silicon substrate as the second substrate 50, relative to the comparative example, and the lattice constant of the c-axis of GaN was further reduced in the case of using the silicon substrate. This means that the use of the silicon substrate as the second substrate may further relieve compressive stress in the light emitting structure layer 20 including the active layer 22.

As set forth above, according to exemplary embodiments of the present inventive concept, after the second substrate having a coefficient of thermal expansion different from a coefficient of thermal expansion of the active layer is bonded at a temperature higher than room temperature, the first substrate may be separated, and while the resultant structure is being cooled to reach room temperature, the residual stress in the active layer may be relieved, and furthermore, luminous efficiency (internal quantum efficiency) of the light emitting device may be increased.

Figure 8:
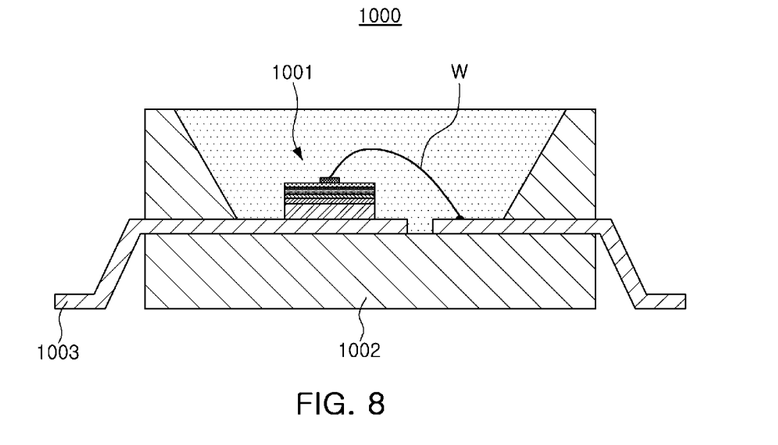
FIGS. 8 and 9 are views illustrating examples of packages employing a semiconductor light emitting device according to an exemplary embodiment of the present inventive concept.
Figure 9:
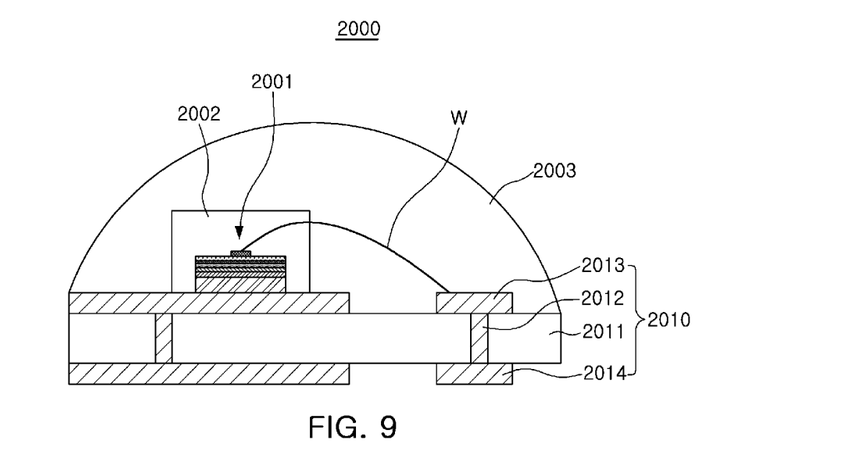

FIGS. 8 and 9 are views illustrating examples of packages employing a semiconductor light emitting device according to an exemplary embodiment of the present inventive concept.

Referring to FIG. 8, a semiconductor light emitting device package 1000 may include a semiconductor light emitting device 1001, a package body 1002, and a pair of lead frames 1003. The semiconductor light emitting device 1001 may be mounted on the lead frames 1003 and electrically connected to the lead frames 1003 through a wire W and through the second substrate 50 (refer to FIG. 4). According to an exemplary embodiment of the present inventive concept, the semiconductor light emitting device 1001 may be mounted on a different region, for example, on the package body 1002, rather than on the lead frames 1003. The package body 1002 may have a cup shape, e.g., a recess, to improve the reflectivity efficiency of light. An encapsulant 1005 formed of a light-transmissive material may be formed in the reflective cup to encapsulate the semiconductor light emitting device 1001, the wire W, and the like. In an exemplary embodiment of the present inventive concept, the semiconductor light emitting device package 1000 may include the semiconductor light emitting device manufactured according to the method of manufacturing a semiconductor light emitting device illustrated in FIGS. 1 through 4, and may include the semiconductor light emitting device manufactured through the method of manufacturing a semiconductor light emitting device illustrated in FIGS. 6A through 6C.

Referring to FIG. 9, a semiconductor light emitting device package 2000 may include a semiconductor light emitting device 2001, a mounting board 2010, and an encapsulant 2003. The semiconductor light emitting device 2001 may be mounted on the mounting board 2010 and electrically connected to the mounting board 2010 through a wire W and through the second substrate 50 (refer to FIG. 4), and in an exemplary embodiment of the present inventive concept, the second substrate 50 may be a conductive substrate.

The mounting board 2010 may include a board body 2011, an upper electrode 2013, and a lower electrode 2014. Also, the mounting board 2010 may include a through electrode 2012 connecting the upper electrode 2013 and the lower electrode 2014. The mounting board 2010 may be provided as a board such as a printed circuit board (PCB), a metal-core printed circuit board (MCPCB), a metal printed circuit board (MPCB), a flexible printed circuit board (FPCB), or the like, and the structure of the mounting board 2010 may be applied to have various forms.

The wavelength conversion part 2002 may include fluorescent materials or quantum dots. The encapsulant 2003 may be formed to have a lens structure with an upper surface having a convex dome shape. However, according to an exemplary embodiment of the present inventive concept, the encapsulant 2003 may have a lens structure having a convex or concave surface to adjust a beam angle of light emitted through an upper surface of the encapsulant 2003.

In an exemplary embodiment of the present inventive concept, the semiconductor light emitting device package 2000 may include the semiconductor light emitting device manufactured through the method of manufacturing a semiconductor light emitting device illustrated in FIGS. 1 through 4, and may include the semiconductor light emitting device manufactured through the method of manufacturing a semiconductor light emitting device illustrated in FIGS. 6A through 6C.

Figure 10:
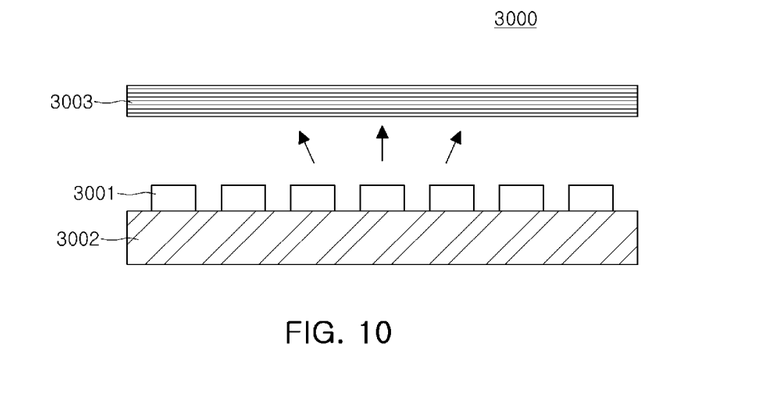
FIGS. 10 and 11 are views illustrating examples of backlight units employing semiconductor light emitting device according to an exemplary embodiment of the present inventive concept.
Figure 11:
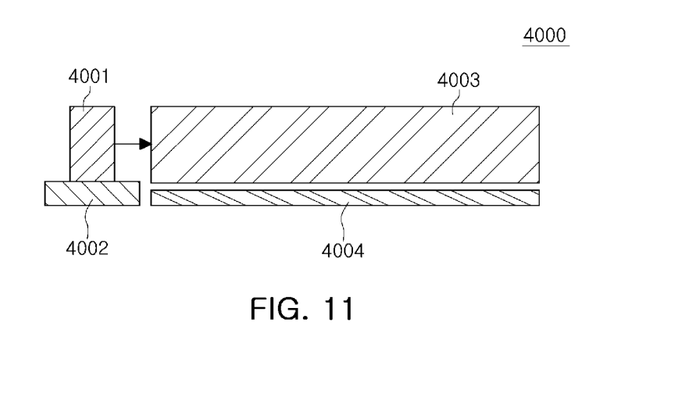

FIGS. 10 and 11 are views illustrating examples of backlight units employing semiconductor light emitting device according to an exemplary embodiment of the present inventive concept.

Referring to FIG. 10, a backlight unit 3000 may include light sources 3001 mounted on a substrate 3002 and one or more optical sheets 3003 disposed above the light sources 3001. The semiconductor light emitting device package having the structure described above with reference to FIGS. 8 and 9 or a structure similar thereto may be used as the light sources 3001. Alternatively, a semiconductor light emitting device may be directly mounted on the substrate 3002 (a so-called chip-on-board (COB) type) and used.

Unlike the backlight unit 3000 in FIG. 10 in which the light sources 3001 emit light toward an upper side where a liquid crystal display is disposed, a backlight unit 4000 as another example illustrated in FIG. 11 may be configured such that a light source 4001 mounted on a substrate 4002 emits light in a lateral direction, and the emitted light may be made to be incident to a light guide plate 4003 so as to be converted into a surface light source. The semiconductor light emitting device package having the structure described above with reference to FIGS. 8 and 9 or a structure similar thereto may be used as the light sources 4001. Light, passing through the light guide plate 4003, is emitted upwards, and in order to enhance light extraction efficiency, a reflective layer 4004 may be disposed on a lower surface of the light guide plate 4003.

Figure 12:
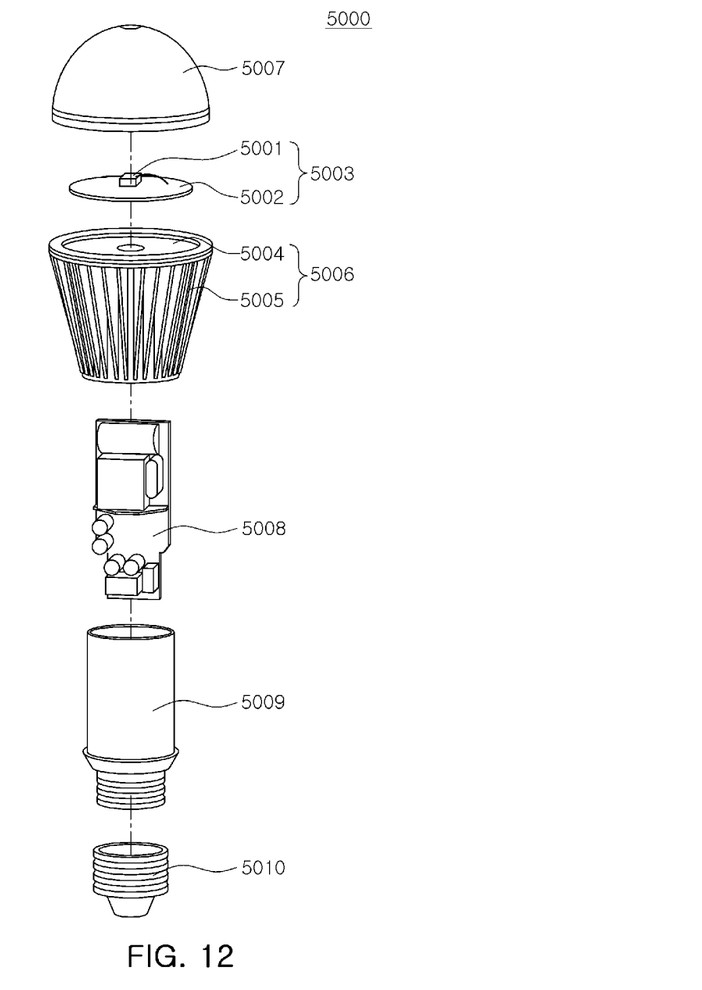
FIG. 12 is a view illustrating an example of a lighting device employing a semiconductor light emitting device according to an exemplary embodiment of the present inventive concept.

FIG. 12 is a view illustrating an example of a lighting device employing a semiconductor light emitting device according to an exemplary embodiment of the present inventive concept.

Referring to the exploded perspective view of FIG. 12, a lighting device 5000 is illustrated as, for example, a bulb-type lamp and may include a light emitting module 5003, a driving unit 5008, and an external connection unit 5010. Also, the lighting device 5000 may further include external structures such as external housings 5006, internal housings 5009 and a cover unit 5007, and the like. The light emitting module 5003 may include a semiconductor light emitting device 5001 having a structure identical or similar to that of the semiconductor light emitting device of FIG. 1 manufactured through at least one of the methods of manufacturing a semiconductor light emitting device illustrated in FIGS. 1 through 4 and 6A through 6C, and a circuit board 5002 having the semiconductor light emitting device 5001 mounted thereon. In an exemplary embodiment of the present inventive concept, a single semiconductor light emitting device 5001 may be mounted on the circuit board 5002, but a plurality of semiconductor light emitting devices may be mounted as needed. Also, the semiconductor light emitting device 5001 may be manufactured as a package and subsequently mounted, rather than being directly mounted on the circuit board 5002.

The external housing 5006 may serve as a heat dissipation unit and may include a heat dissipation plate 5004 disposed to be in direct contact with the light emitting module 5003 to enhance heat dissipation, and heat dissipation fins 5005 surrounding the lateral surfaces of the lighting device 5000. Also, the cover unit 5007 may be installed on the light emitting module 5003 and have a convex lens shape. The driving unit 5008 may be installed in the internal housing 5009 and connected to the external connection unit 5010 having a socket structure to receive power from an external power source. Also, the driving unit 5008 may convert power into an appropriate current source for driving the semiconductor light emitting device 5001 of the light emitting module 5003, and provide the same. For example, the driving unit 5008 may be configured as an AC-DC converter, a rectifying circuit component, or the like.

Also, although not shown, the lighting device 5000 may further include a communications module.

Figure 13:
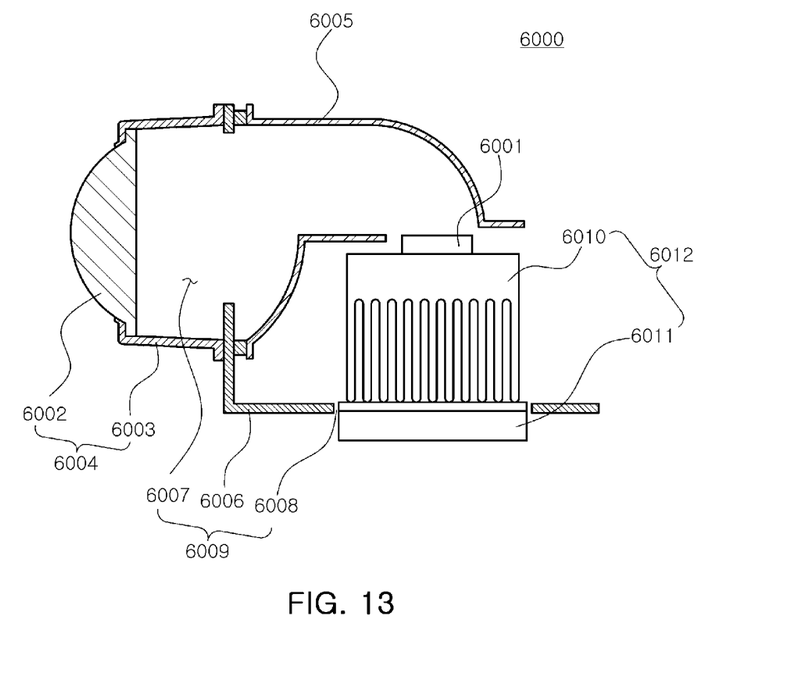
FIG. 13 is a view illustrating an example of a headlamp employing a semiconductor light emitting device according to an exemplary embodiment of the present inventive concept.

FIG. 13 is a view illustrating an example of a headlamp employing a semiconductor light emitting device according to an exemplary embodiment of the present inventive concept.

Referring to FIG. 13, a headlamp 6000 used as a vehicle lamp, or the like, may include a light source 6001, a reflective unit 6005, and a lens cover unit 6004. The lens cover unit 6004 may include a hollow guide 6003 and a lens 6002. The light source 6001 may include at least one of semiconductor light emitting device packages of FIGS. 8 and 9. The headlamp 6000 may further include a heat dissipation unit 6012 outwardly dissipating heat generated by the light source 6001. In order to effectively dissipate heat, the heat dissipation unit 6012 may include a heat sink 6010 and a cooling fan 6011. Also, the headlamp 6000 may further include a housing 6009 fixedly supporting the heat dissipation unit 6012 and the reflective unit 6005, and the housing 6009 may have a body unit 6006 and a central hole 6008 formed in one surface thereof, in which the heat dissipation unit 6012 is coupled. Also, the housing 6009 may have a front hole 6007 formed in the other surface integrally connected to the one surface and bent in a right angle direction. The reflective unit 6005 may be fixed to the housing 6009 such that light generated by the light source 6001 is reflected thereby to pass through the front hole 6007 to be outputted outwardly.

While exemplary embodiments have been shown and described above, it will be apparent to those skilled in the art that modifications and variations could be made without departing from the spirit and scope of the present disclosure as defined by the appended claims.

What is claimed is:

1. A method of manufacturing a semiconductor light emitting device, the method comprising:
   forming a light emitting structure layer including an active layer on a first substrate;
   bonding the second substrate to the light emitting structure layer at a first temperature higher than room temperature;
   removing the first substrate from the light emitting structure layer at a second temperature higher than room temperature; and
   cooling the second substrate and the light emitting structure to reach room temperature,
   wherein the active layer has a compressive stress induced thereto after the forming of the light emitting structure layer, and the second substrate has a coefficient of thermal expansion lower than a coefficient of thermal expansion of the active layer to induce tensile stress in the active layer during the cooling of the second substrate.

2. The method of claim 1, wherein the second substrate is any one material selected from the group consisting of Si, SiC, AlN, GaP, InP, and graphite.

3. The method of claim 1, wherein the first substrate is a sapphire substrate, and the light emitting structure layer including the active layer includes a Group III-V nitride semiconductive material.

4. The method of claim 1, wherein the second temperature is lower than or equal to the first temperature.

5. The method of claim 1, wherein a difference in coefficients of thermal expansion between the active layer and the second substrate is within a range of 0.5×10-6/K to 3.0×10-6/K.

6. The method of claim 1, wherein the bonding of the second substrate to the light emitting structure layer is performed by eutectic bonding of a bonding metal.

7. The method of claim 5, wherein the bonding metal is a gold alloy having a eutectic temperature of 200° C. or higher.

8. The method of claim 1, wherein the removing of the first substrate is performed by laser lift-off (LLO).

9. The method of claim 1, wherein a thickness of the second substrate is greater than a thickness of the light emitting structure layer.

10. The method of claim 1, wherein the light emitting structure layer further includes a reflective metal layer disposed on a surface thereof in contact with the second substrate.

11. The method of claim 1, further comprising forming an electrode on a surface of the light emitting structure layer from which the first substrate has been removed.

12. The method of claim 1, further comprising
   forming a conductive via penetrating through the second semiconductor layer and the active layer before bonding the second substrate; and
   forming an electrode on an upper surface of the second semiconductor layer after cooling the second substrate and the light emitting structure.

13. A method of manufacturing a semiconductor light emitting device package, the method comprising:
   manufacturing a semiconductor light emitting device according to the method of claim 1;
   mounting the semiconductor light emitting device on one of a pair of lead frames, and
   electrically connecting the semiconductor light emitting device to the other of the lead frames through a wire and to the one of the lead frames through the second substrate of the semiconductor light emitting device.

14. A method of manufacturing a semiconductor light emitting device package, the method comprising:
   manufacturing a semiconductor light emitting device according to the method of claim 1;
   mounting the semiconductor light emitting device on a first portion of a mounting board; and
   electrically connecting the semiconductor light emitting device to a second portion of the mounting board separated from the first portion through a wire, and to the first portion of the mounting board through the second substrate of the semiconductor light emitting device.

15. A method of manufacturing a semiconductor light emitting device, the method comprising:
   forming a light emitting structure layer including an active layer on a first substrate;
   bonding the second substrate to the light emitting structure layer at a first temperature higher than room temperature;
   removing the first substrate from the light emitting structure layer at a second temperature higher than room temperature; and
   cooling the second substrate and the light emitting structure to reach room temperature,
   wherein the active layer has a tensile stress induced thereto after the forming of the light emitting structure layer, and the second substrate has a coefficient of thermal expansion greater than a coefficient of thermal expansion of the active layer to induce compressive stress in the active layer during the cooling of the second substrate.

16. A method of manufacturing a semiconductor light emitting device, the method comprising:

forming, on a first substrate, a light emitting structure layer to include an active layer;

determining whether compressive or tensile stress is induced in the active layer;

selectively forming, based on a result of the determination, a second substrate to have a material having a coefficient of thermal expansion lower than a coefficient of thermal expansion of the active layer or to have a material having a coefficient of thermal expansion greater than the coefficient of thermal expansion of the active layer;

bonding the second substrate to the light emitting structure layer at a first temperature higher than room temperature, removing the first substrate from the light emitting structure layer at a second temperature higher than room temperature;

cooling the second substrate and the light emitting structure to reach room temperature, wherein the second substrate is formed to have a material having a coefficient of thermal expansion lower than the coefficient of thermal expansion of the active layer, when it is determined that compressive stress is induced in the active layer.

\* \* \* \* \*